United States Patent [19]
de Wit

[11] Patent Number: 5,170,075
[45] Date of Patent: Dec. 8, 1992

[54] SAMPLE AND HOLD CIRCUITRY AND METHODS

[75] Inventor: Michiel de Wit, Dallas, Tex.

[73] Assignee: Texas Instruments Incorporated, Dallas, Tex.

[21] Appl. No.: 713,657

[22] Filed: Jun. 11, 1991

[51] Int. Cl.$^5$ .................... H03K 17/687; G11C 27/02
[52] U.S. Cl. .................... 307/353; 307/491; 307/576
[58] Field of Search ................ 307/572–576, 307/352, 353, 491

[56] References Cited

U.S. PATENT DOCUMENTS

| | | | |
|---|---|---|---|
| 3,764,921 | 10/1973 | Huard | 307/575 |
| 4,158,149 | 6/1979 | Otofuji | 307/352 |
| 4,323,796 | 4/1982 | Lathrope | 307/572 |
| 4,529,897 | 7/1985 | Suzuki et al. | 307/573 |
| 4,922,130 | 5/1990 | Swerlein | 307/353 |
| 5,008,729 | 4/1991 | Wills et al. | 357/51 |

Primary Examiner—John Zazworsky
Attorney, Agent, or Firm—Ira S. Matsil; B. Peter Barndt; Richard L. Donaldson

[57] ABSTRACT

A sample and hold circuit (24) is provided which includes an input terminal (36) for receiving a time varying input voltage. A first capacitor (14) maintains a first voltage corresponding to a sample of said time varying input voltage. A switch (12) having a control terminal (20) is operable to sample the input voltage by coupling input terminal (36) to first capacitor (14) in response to a sampling signal provided at control terminal (20). At least one second capacitor (58, 86) is provided for maintaining a preselected voltage. Circuitry (40, 42, 68, 106) is provided for selectively applying the sampling signal to control terminal (20) of switch (12) by impressing at least the preselected voltage maintained by second capacitor (58, 86) on control terminal (20).

24 Claims, 3 Drawing Sheets

SAMPLE AND HOLD CIRCUITRY AND METHODS

TECHNICAL FIELD OF THE INVENTION

The present invention relates in general to electronic circuitry and in particular to sample and hold circuitry and methods.

BACKGROUND OF THE INVENTION

Sample and hold circuitry plays an important role in numerous signal processing applications. In particular, sample and hold circuitry plays a significant role in analog-to-digital converters. The typical sample and hold circuit includes a switching device, such as a transistor, and a capacitor. A time-varying input signal being sampled is periodically switched to the capacitor, thereby charging or discharging the capacitor, depending on the voltage of the signal as referenced to the voltage already across the capacitor at the time of the sample. Between each of the sampling intervals is a hold interval during which the voltage level stored on the capacitor represents the signal sample. The stored voltage level for the signal sample can then be fed to the input of an analog-to-digital converter which provides an n-bit binary number proportional to the voltage level. The n-bit binary number therefore represents an approximation of the input signal at the time of the sample.

One possible implementation of a sample and hold circuit utilizes a metal oxide semiconductor field effect transistor (MOSFET) as the switching (sampling) device. In this case, the input signal $V_{sig}$ to be sampled is applied to the drain of the field effect transistor and the gate is tied to the sampling signal $V_{sample}$. The source of the field effect transistor is coupled to the capacitor and an output buffer. During the active state of sampling signal $V_{sig}$, the MOSFET passes input signal $V_{sig}$ through its source/drain path to the capacitor thereby sampling signal $V_{sig}$. The use of MOSFET as the switching device has significant advantages such as fabrication compatibility with complementary metal oxide semiconductor (CMOS) devices making up the associated processing circuitry. The use of the MOSFET, however, introduces the significant disadvantage of "aperture uncertainty."

With the use of the MOSFET, there are two significant sources of aperture uncertainty which occurs during transistor turn-off at the end of sampling. First, because of back-biasing effects, the threshold voltage $V_t$ of the MOSFET will vary as a function of the input signal applied to the drain. The variation in threshold voltage $V_t$ in turn changes the time at which the MOSFET turns off, thereby introducing timing errors. Second, the fall time of the sampling signal $V_{sample}$ is finite. Since an n channel field effect transistor will turn off when $V_{sample} - V_{sig} = V_t$, and even if the variation in the threshold voltage $V_t$ due to back-biasing is discounted, the turn off time of the field effect transistor is still dependent on the time varying input signal $V_{sig}$. In other words, the transistor will turn off at different times for different values of the input signal $V_{sig}$. Again, timing errors are being introduced since the turn off time will be different for different values of $V_{sig}$.

Thus, a need has risen for circuitry and methods for reducing aperture uncertainty in sample and hold circuits.

SUMMARY OF THE INVENTION

According to the invention, a sample and hold circuit is provided which includes an input terminal for receiving a time varying input voltage. A first capacitor maintains a first voltage corresponding to a sample of the time varying input voltage. A switch having a control terminal is operable to sample the input voltage by coupling the input terminal to the first capacitor in response to a sampling signal provided at the control terminal. At least one second capacitor maintains a preselected voltage. Circuitry is provided for selectively applying the sampling signal to the control terminal of the switch by impressing at least the preselected voltage maintained by at least one second capacitor on the control terminal.

According to further aspects of the present invention, the preselected voltage is stacked on the input signal such that the sampling signal applied has a voltage substantially equal to the sum of the voltage of the input signal and the preselected voltage. According to other aspects of the invention, the second capacitor is charged to at least the voltage of said input signal, the second capacitor being discharged to provide the sampling signal.

The sample and hold circuit employing the present invention has substantially reduced aperture uncertainty as compared with prior art devices. By maintaining a preselected voltage on a capacitor and then impressing that preselected voltage onto the control terminal of the switch, the switch is turned on by a substantially large signal such that the switch turns on during the short interval of time, even for small voltage values of the time varying input voltage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
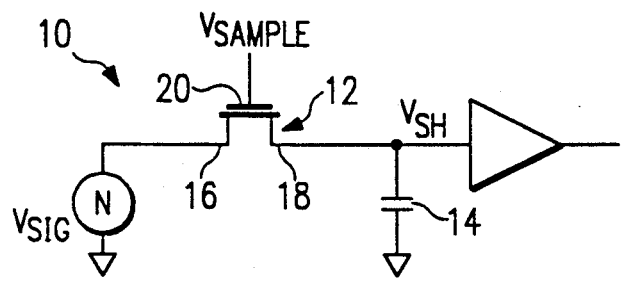
FIG. 1 is a schematic diagram of a sample and hold circuit according to the prior art.

Referring first to FIG. 1, a sample and hold circuit 10 is depicted as known in the art. Sample and hold circuitry 10 includes a metal oxide semiconductor field effect transistor (MOSFET) 12 and a capacitor 14. A time-varying input signal $V_{sig}$ is coupled to the first source/drain 16 of transistor 12 while the second source/drain 18 of transistor 12 is coupled to the first plate of capacitor 14. The second plate of capacitor 14 is grounded. A gate 20 of transistor 12 is coupled to a sampling signal $V_{sample}$. An output buffer 21 coupled to the first plate of capacitor 14 to drive the next stage (not shown) of the associated system.

Figure 2A:
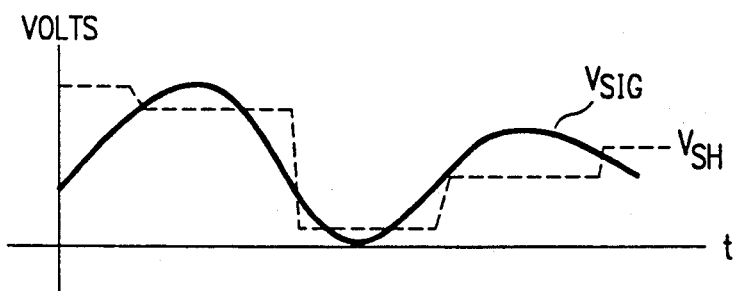
FIGS. 2a and 2b are voltage-time graphs depicting the time relationships between the input signal $V_{sig}$, the sample and hold voltage $V_{sh}$ across the sample and hold capacitor and the sampling signal $V_{sample}$, as typically found during the operation of the circuit depicted in FIG. 1.
Figure 2B:
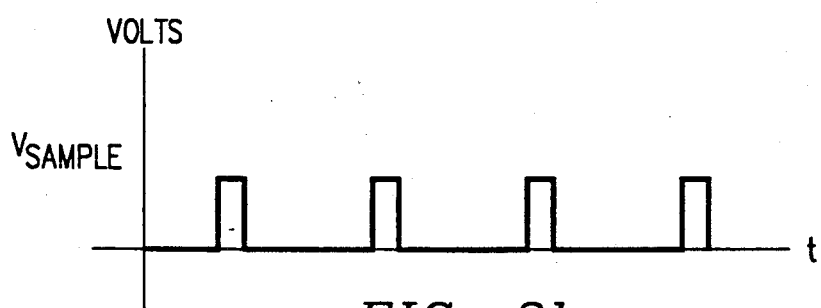

FIGS. 2a and 2b depict the voltage/time relationships between the input signal $V_{sig}$, the voltage across capacitor 14 $V_{sh}$ and the sampling signal $V_{sample}$. As is depicted, with each active period of the sampling signal, the voltage $V_{sh}$ across the capacitor 14 is stepped so as to approximate the voltage of input $V_{sig}$ at the time of sampling. Each voltage step can, in turn, be converted into a series of digital bits thereby completely converting the input signal $V_{sig}$ into the digital domain.

Figure 3:
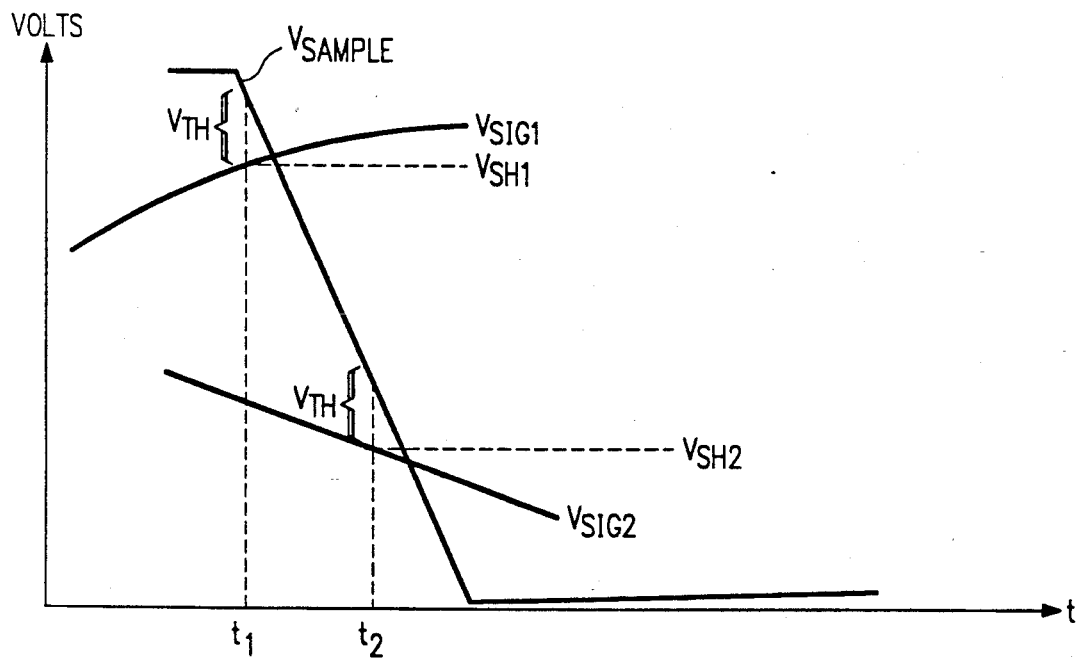
FIG. 3 is a voltage graph time depicting the time relationship between the sampling signal $V_{sample}$ and the input signal $V_{sig}$ during the turn off of a conventional sample and hold signal.

Sample and hold circuit 10, as depicted in FIG. 1, is subject to aperture uncertainty. First, the MOSFET threshold voltage $V_t$ depends on the back-bias which is proportional to the input signal voltage $V_{sig}$. Second, discounting the change in threshold due to the back-biasing, the turn off time still depends on the difference between the voltage $V_{sample}$ applied to the gate and the voltage $V_{sig}$ applied to the drain. When $V_{sample} - V_{sig} = V_{th}$, the MOSFET turns off. The sampling signal $V_{sample}$, however, has a finite fall time while the value of $V_{sig}$ is constantly changing. Thus, the time at which the field effect transistor turns off is dependent on the time varying signal $V_{sig}$ resulting in inconsistent sampling. This problem is most easily understood by referring to FIG. 3. In FIG. 3, $V_{sig1}$ is a portion of the input voltage $V_{sig}$ during a time interval when the voltage is increasing while $V_{sig2}$ is a portion of input voltage $V_{sig}$ during an interval when the voltage is decreasing. In FIG. 3, the sampling signal $V_{sample}$ is shown having a slope indicating a non-negligible fall time. As is depicted in FIG. 3, because of the slope of $V_{sample}$, the larger signal $V_{sig1}$ gets sampled earlier than the smaller one, $V_{sig2}$, thereby causing aperture uncertainty in the samplings of $V_{sh1}$ and $V_{sh2}$. Specifically, signal $V_{sig1}$ gets sampled at time $t_1$, when the voltage on gate 20 of transistor 12 drops below the voltage $V_{sig1}$ plus the threshold voltage $V_{th}$ on transistor 12. Similarly, signal $V_{sig2}$ gets sampled at time $t_2$ when the voltage on gate 20 drops below the voltage $V_{sig2}$ plus the threshold $V_{th}$ of transistor 12.

Figure 4:
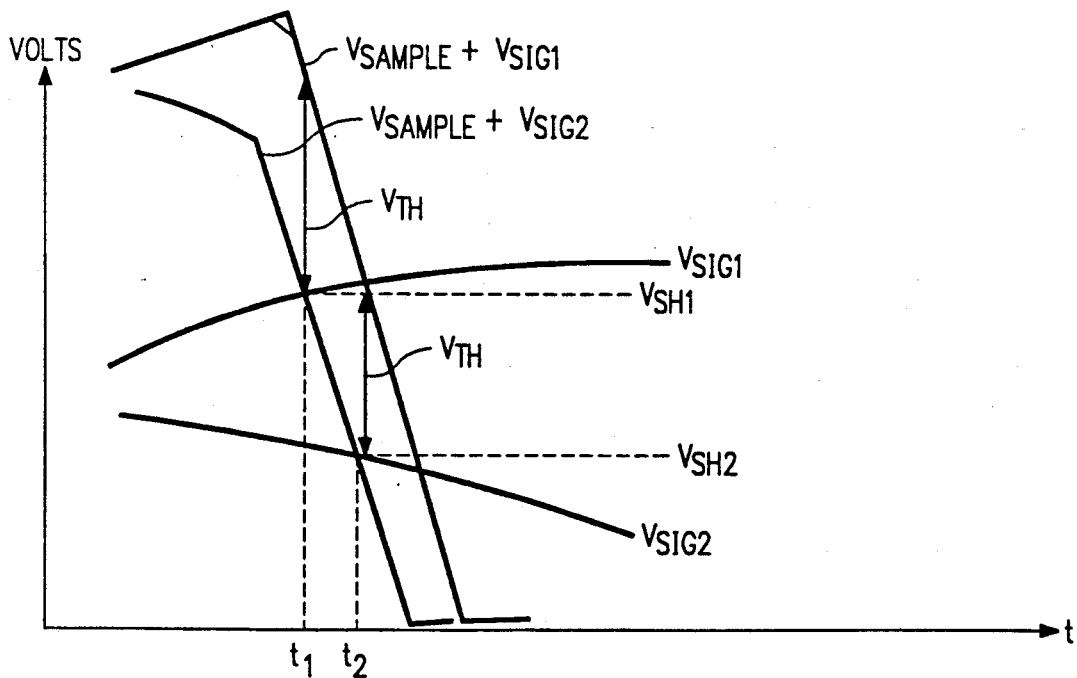
FIG. 4 is a voltage-time graph depicting the time relationship between the sampling signal $V_{sample}$ and the input signal $V_{sig}$ during the turn-off of a sample and hold using the principles of the present invention.

The aperture uncertainty due to the inherent non-negligible fall time of the sampling signal $V_{sample}$ can be substantially reduced if the sampling signal applied to gate 20 of MOSFET 12 is substantially equivalent to $V_{sig} + V_{sample}$. As depicted in FIG. 4, if the fall time of the sampling signal $V_{sample} + V_{sig}$ is independent of the input signal $V_{sig}$, then the turn off times $t_1$ and $t_2$, associated with the input signal regions $V_{sig1}$ and $V_{sig2}$ respectively, can be moved significantly closer together.

Figure 5:
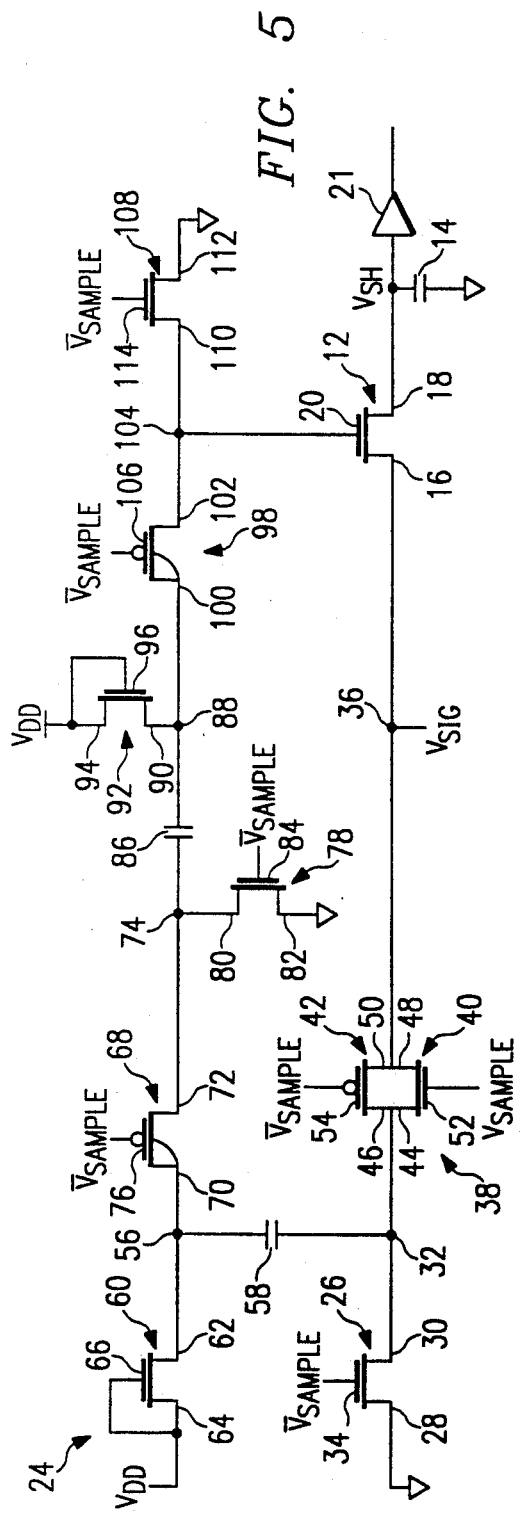
FIG. 5 is an electrical schematic diagram of a first embodiment of the present invention.

FIG. 5 depicts a first illustrated embodiment 24 of a switching circuit which drives the gate of transistor 12 to minimize aperture uncertainty due to the non-negligible turn off time of transistor 12. Switching circuitry 24 includes a first field effect transistor 26 having its first source/drain 28 coupled to ground, its second source/drain 30 coupled to node 32 and its gate 34 coupled to sampling $\overline{V}_{sample}$. Node 32 in turn is coupled to input node 36 by transmission gate 38. Transmission gate 38 comprises an n channel transistor 40 and a p channel transistor 42. First source/drain region 44 of transistor 40 is coupled to first source/drain 46 of transistor 42 with both source/drain regions 44 and 46 coupled to node 32. Second source/drain region 48 of transistor 40 is coupled to second source/drain region 50 of transistor 42 with both source/drain regions 48 and 50 coupled to node 36. The gate 52 of n channel transistor 40 is coupled to sampling signal $V_{sample}$ while the gate 54 of p channel transistor 42 is coupled to a complement of the sampling signal, $\overline{V}_{sample}$.

Node 32 is coupled to node 56 by a first capacitor 58. An n channel field effect transistor 60 has its first source/drain 62 coupled to node 56 and its second source/drain 64 coupled to voltage supply rail $V_{dd}$ (typically +5V). The gate 66 of transistor 60 is also coupled to the voltage supply rail $V_{dd}$.

A p channel transistor 68 has a first source/drain region 70 coupled to node 56 and a second source/drain region 72 coupled to node 74. The tank of transistor 68 is coupled to source/drain region 70 and the gate 76 of transistor 68 coupled to control signal $\overline{V}_{sample}$. An n channel transistor 78 has its first source/drain 80 coupled to node 74 and its second source/drain 82 coupled to ground. The gate 84 of n channel transistor 78 is also coupled to sampling signal $\overline{V}_{sample}$.

Second capacitor 86 is coupled between node 74 and node 88. Also coupled to node 88 is a first source/drain region 90 of transistor 92. The second source/drain 94 and the gate 96 of transistor 92 are coupled to voltage supply rail $V_{dd}$. A p channel transistor 98 has a first source/drain 100 coupled to node 88 and a second source/drain 102 coupled to node 104. The gate 106 of p channel transistor 98 is coupled to sampling signal $\overline{V}_{sample}$.

An n channel field effect transistor 108 has a first source/drain 110 coupled to node 104 and a second source/drain 112 coupled to ground. The gate 114 of transistor 108 is coupled to sampling signal $\overline{V}_{sample}$.

Node 104 is coupled to the gate 20 of sample and hold switching transistor 12 such that the voltage appearing at node 104 controls the on/off state of transistor 12. Source/drain 16 of transistor 12 is coupled to input node 36 to receive the input signal $V_{sig}$ while the second source/drain 18 of transistor 12 is coupled to sample and hold capacitor 14 to pass the input $V_{sig}$ to capacitor 14 for sampling.

During the hold period, when $V_{sample}$ is low and $\overline{V}_{sample}$ is high, capacitors 58 and 86 are charged such that nodes 56 and 88 are each at a voltage of approximately $V_{dd} - V_t$. The charge on capacitor 58 is controlled by transistors 60 and 26, a one threshold voltage drop $V_t$ appearing across transistor 60. At the same time, capacitor 86 is charged by turning on transistors 92 and 78, a one threshold voltage drop $V_t$ occurring across transistor 92. When sampling occurs (i.e., $V_{sample}$ is high and $\overline{V}_{sample}$ is low) input signal $V_{sig}$ is passed to node 32 via transmission gate 38. The voltages across capacitors 58 and 86 are then stacked on the input signal $V_{sig}$ appearing at input node 36 with the simultaneous turn on of p channel transistors 68 and 98. Thus, the voltage at node 104 is brought to a voltage of approximately $V_{sig} + 2V_{dd} - 2V_t$. The voltage appearing at gate 20 of transistor 12 is now a function of the input signal $V_{sig}$ appearing at source/drain 16 such that differences in turn off times are substantially reduced.

Since the tanks of transistors 68 and 98 are tied to their respective first source/drains 70 and 100, they track the voltages applied to respective source/drain regions 70 and 100. This configuration minimizes aperture uncertainty due to changes in the threshold voltages of transistor 68 and 98 due to back-biasing. In the illustrated embodiment, transistors 68 and 98 are selected to be p channel transistors since they are required to pass signals having voltages close to $V_{dd}$. The use of pass gate 38 in the preferred embodiment also provides technical advantages. Specifically, the use of back-to-back n channel transistor 40 and p channel transistor 42 allows the passage of an input signal $V_{sig}$ having a voltage range all the way from 0 volts to $V_{dd}$, p channel transistor 42 helping to pass voltages close to $V_{dd}$ and n channel transistor 40 helping to pass voltages close to 0 volts.

Figure 6:
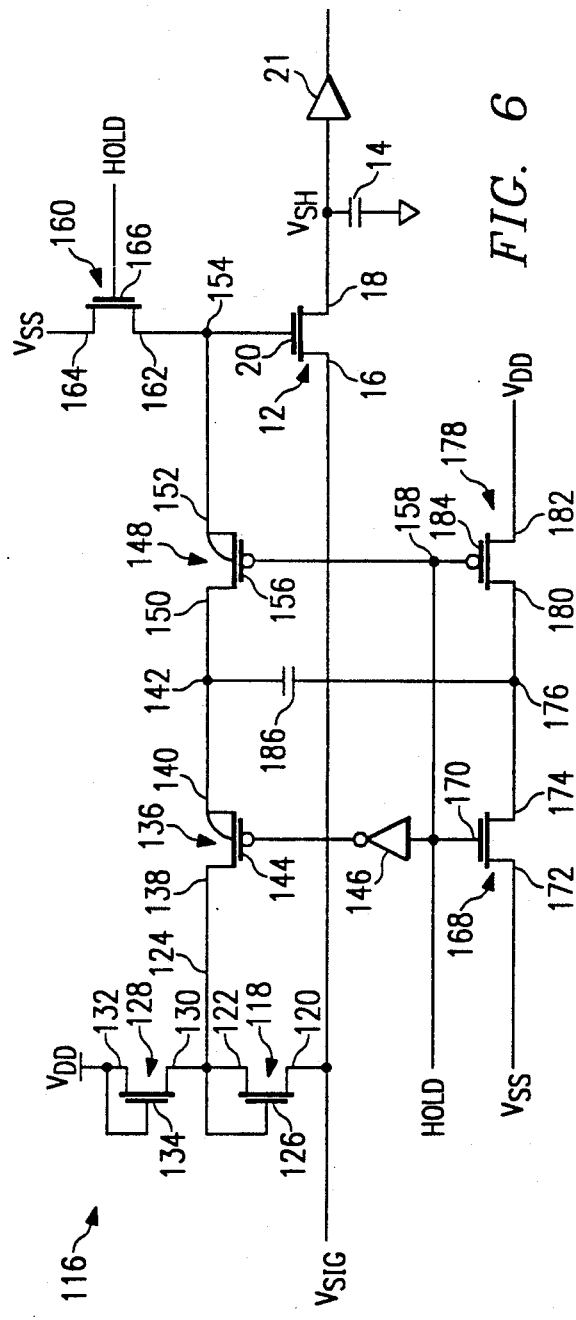
FIG. 6 is an electrical schematic of a second embodiment of the present invention.

Referring next to FIG. 6, a second embodiment is shown generally at 116 which additionally accounts for changes in the threshold voltage of transistor 12 due to back-biasing. This circuit is most useful when the voltage of input signal $V_{sig}$ is less than $V_{dd} - 2V_t$. Circuit 116 includes a first n channel field effect transistor 118 having a first source/drain 120 coupled to the input signal $V_{sig}$. The second source/drain 122 of transistor 118 is coupled to node 124 as is the gate 126. A second n channel transistor 128 also has its first source/drain 130 coupled to node 124. Both the second source/drain 132 and the gate 134 of transistor 128 are coupled to the voltage supply rail $V_{dd}$.

A first p channel field effect transistor 136 has its first source/drain 138 coupled to node 124 and its second source/drain 140 coupled to node 142. The tank of transistor 136 is coupled to second source/drain 140. The gate 144 of transistor 136 is coupled to the output of invertor 146. A second p channel transistor 148 has its first source/drain 150 coupled to node 142 and its second source/drain 152 coupled to node 154. The tank of transistor 148 is coupled to second source/drain 152 while the gate 156 is coupled to node 158.

Node 154 is coupled to the gate 20 of sampling transistor 12. An n channel transistor 160 has a first source/drain 162 also coupled to node 154. The second source/drain 164 of transistor 160 is coupled to low voltage supply rail $V_{ss}$ (typically 0 volts) while the gate 166 is coupled to the signal HOLD.

The signal HOLD is additionally coupled to node 158 as is the input of invertor 146. An n channel transistor 168 has its gate 170 coupled to node 158. A first source/drain 172 of transistor 168 is coupled to low voltage supply $V_{ss}$ and a second source/drain 174 coupled to node 176. A p channel transistor 178 has a first source/drain coupled to node 176, a second source/drain 182 coupled to voltage supply $V_{dd}$ and a gate 184 coupled to node 158.

A capacitor 186 capacitively couples nodes 142 and 176.

The voltage at node 124 is approximately the sum of the input voltage $V_{sig}$ and the threshold voltage $V_t$ of transistor 118. This voltage is coupled into capacitor 186 by transistors 136 and 168 during the holding period when signal HOLD is high. Also during the holding period, transistor 160 shuts off sampling transistor 12 by bringing gate 20 to the low voltage rail $V_{ss}$.

During the sampling period when holding signal HOLD is deasserted, transistors 144 and 168 are shut off and transistors 148 and 178 turn on. The plate of capacitor 186 coupled to node 176 is thereby pulled to the high voltage supply rail $V_{dd} - V_t$ while the plate of capacitor 186 coupled to node 142 rises to a voltage $V_{dd} + V_{sig} + V_{th}(V_{sig})$ where the threshold voltage $V_{th}$ is a function of the input signal $V_{sig}$. The voltage at node 142 is then coupled to gate 20 of transistor 12 to sample input signal $V_{sig}$.

As with the first illustrated embodiment, circuit 116 produces a signal $V_{sample}$ which is a function of $V_{sig}$. Further, the sampling voltage of $V_{sample}$ is made larger by the coupling in of the supply voltage rail voltage $V_{dd}$. Thus, a strong signal which accounts for differences in the input signal voltage turns off transistor 12 such that the shut off times for varying voltages of signal $V_{sig}$ do not vary substantially. Further, with the second illustrated embodiment, changes in the threshold voltage of transistor 12 are also accounted for. Source/drain 120 of transistor 118 is coupled to the input signal $V_{sig}$ as is source/drain 16 of transistor 12. Thus, the change in the threshold voltage $V_t$ of transistor 118 substantially tracks the change in threshold voltage of transistor 12. The change in threshold voltage $V_t$ of transistor 118 is reflected in the voltage of node 124 which has an approximate value of $V_{sig} + V_{th}(V_{sig})$ where the threshold voltage $V_{th}$ is a function of the input voltage $V_{sig}$. This voltage is coupled to capacitor 186 and impressed on gate 20 of transistor 12, thereby substantially compensating for the change in threshold voltage $V_t$ of transistor 12 as a function of input signal $V_{sig}$.

While preferred embodiments of the invention and their advantages have been set forth in the above-detailed description, the invention is not limited thereto, but only by the scope and spirit of the appended claims.

What is claimed is:

1. A sample and hold circuit comprising:
   an input terminal for receiving a time varying input voltage;
   a first capacitor for maintaining a first voltage corresponding to a sample of said time varying input voltage;
   a switch having a control terminal and operable to sample said input voltage by coupling said input terminal to said first capacitor in response to a sampling signal provided at said control terminal;
   second and third capacitors for maintaining a preselected voltage, a first plate of third capacitor coupled to a first plate of said second capacitor and a second plate of said third capacitor coupled to circuitry for coupling said third capacitor to a reference voltage; and
   circuitry coupled to said second capacitor for selectively providing said sampling signal to said control terminal of said switch by impressing at least said preselected voltage maintained by said second capacitor on said control terminal.

2. The sample and hold circuit of claim 1, wherein said circuitry for selectively providing said sampling signal impresses at least said input voltage on said control terminal.

3. The sample and hold circuit of claim 1 and further comprising circuitry coupled to said second and third capacitors for charging said second and third capacitors to a second voltage.

4. The sample and hold circuit of claim 1 and further comprising circuitry coupled to said second capacitor for charging said second capacitor to a second voltage.

5. The sample and hold circuit of claim 1, wherein said switch comprises a field effect transistor.

6. A sample and hold circuit comprising:
   an input terminal for receiving a time varying input voltage;
   a sample and hold capacitor for maintaining a first voltage corresponding to a sample of said time varying input voltage;

a sample and hold transistor having a current path and a control electrode, said current path operable to couple said input signal to said sample and hold capacitor in response to a sampling signal applied to said control electrode;

first and second storage capacitors for storing a sample and hold signal component, a first plate of said second storage capacitor coupled to a first plate of said first storage capacitor; and circuitry operable to couple said second plate of said second storage capacitor to said input terminal and to couple a second plate of said first storage capacitor to said control electrode of said sample and hold transistor, such that a sample and hold signal is applied to said control electrode that includes said sample and hold signal component and said time varying input voltage.

7. The sample and hold circuit of claim 6 wherein said sample and hold transistor comprises a field effect transistor.

8. The sample and hold circuit of claim 7 wherein said field effect transistor comprises an n-channel field effect transistor.

9. The sample and hold circuit of claim 6 and further comprising storage capacitor circuitry for charging said second storage capacitor, said circuitry for charging said second storage capacitor comprising a voltage source coupled to said first plate of said second storage capacitor and a switch coupled to said second plate of said second storage capacitor for selectively coupling said second plate of said second storage capacitor to a reference voltage.

10. The sample and hold circuit of claim 6 and further comprising circuitry for providing said sampling signal comprising:
a transmission gate coupling said input terminal with said second plate of said second storage capacitor;
a first transistor coupled between said first and second storage capacitors; and
a second transistor having a first source/drain coupled to said second plate of said first storage capacitor and a second source/drain coupled to said gate of said sample and hold transistor.

11. The sample and hold circuit of claim 10 wherein a tank of said first field effect transistor is coupled to said first source/drain of said first field effect transistor and a tank of said second field effect transistor is coupled to said first source/drain of said second field effect transistor.

12. The sample and hold circuit of claim 11 wherein said first and second field effect transistors comprise p-channel field effect transistors.

13. Sample and hold circuitry comprising: an input terminal for receiving a time varying input voltage;
a first capacitor for maintaining a voltage corresponding to a sample of said input voltage;
a first n channel field effect transistor having a gate, first source/drain coupled to said input terminal and a second source/drain coupled to a first plate of said first capacitor;
a transmission gate a having a transmission path, a first terminal of said transmission path coupled to said input terminal and a second terminal of said transmission path coupled to a first plate of a second capacitor;
a first p channel field effect transistor having a first source/drain coupled to a second plate of said second capacitor, a second source/drain coupled to a first plate of a third capacitor, a tank coupled to said first source/drain of said first p channel field effect transistor and a gate coupled to a control signal; and a second p channel field effect transistor having a first source/drain coupled to a second plate of said third capacitor, a second source/drain coupled to said gate of said first n channel field effect transistor, a tank coupled to said first source/drain region of said second field effect transistor and a gate coupled to said control signal.

14. The sample and hold circuitry of claim 13 and further comprising:
a second n channel field effect transistor having a first source/drain coupled to said first plate of said second transistor, a second source/drain coupled to ground and a gate coupled to said control signal; and
a third n channel field effect transistor having a first source/drain coupled to said second plate of said second capacitor, a second source/drain coupled to a voltage supply rail and a gate coupled to said second source/drain.

15. The sample and hold circuit of claim 14 and further comprising:
a fourth n channel field effect transistor having a first source/drain coupled to said first plate of said third capacitor, a second source/drain coupled to ground and a gate coupled to said control signal; and
a fifth n channel field effect transistor having a first source/drain coupled to said second plate of said third capacitor, a second source/drain coupled to said voltage supply rail and a gate coupled to said second source/drain.

16. The sample and hold circuitry of claim 15 and further comprising a sixth n channel field effect transistor having a first source/drain coupled to said gate of said first n channel field effect transistor, a second source/drain coupled to ground and a gate coupled to said control signal.

17. The sample and hold circuitry of claim 16, wherein said transmission gate comprises:
a p channel field effect transistor having a first source/drain coupled to said input terminal, a second source/drain coupled to said first plate of said second capacitor and a gate coupled to said control signal; and
an n channel field effect transistor having a first source/drain coupled to said input terminal, a second source/drain coupled to said first plate of said second capacitor and a gate coupled to a complement of said control signal.

18. Sample and hold circuitry comprising:
an input terminal for receiving an input signal;
a sample and hold capacitor for maintaining a first voltage corresponding to a sample of said input signal;
a sample and hold field effect transistor having a first source/drain coupled to said input terminal, a second source/drain coupled to said sample and hold capacitor, and gate;
a second field effect transistor having a first source/drain coupled to said input terminal, a second source/drain, and a gate coupled to said second source/drain;
a second capacitor;

circuitry for selectively coupling said second source/drain of said second field effect transistor to a first plate of said second capacitor whereby said second capacitor is charged at least to a voltage appearing at said second source/drain of said second field effect transistor; and circuitry for selectively coupling said first plate of said second capacitor to said gate of said sample and hold capacitor whereby a sampling voltage applied to said gate of said sample and hold capacitor is at least said voltage appearing at said second source/drain of said second field effect transistor.

19. The sample and hold circuitry of claim 18, wherein said sample and hold field effect transistor comprises an n channel field effect transistor.

20. The sample and hold circuitry of claim 18, wherein changes in a threshold voltage of said second transistor tracks changes in a threshold voltage of said sample and hold transistor.

21. The sample and hold circuitry of claim 20, wherein said circuitry for selectively coupling said second source/drain of said second field effect transistor comprises a third field effect transistor having a first source/drain coupled to said second source/drain of said second field effect transistor and a second source/drain coupled to said first plate of said second capacitor.

22. The sample and hold circuitry of claim 21, wherein said third field effect transistor comprises a p channel transistor, a tank of said third transistor tied to said second source/drain of said p channel transistor.

23. The sample and hold circuitry of claim 22, wherein said circuitry for coupling said first plate of said second capacitor to said gate of said sample and hold field effect transistor comprises a fourth field effect transistor having a first source/drain coupled to said first plate and a second source/drain coupled to said gate.

24. The sample and hold circuitry of claim 23, wherein said fourth field effect transistor comprises a p channel transistor, a tank of said fourth transistor tied to said second source/drain of said fourth transistor.

* * * * *